US011923436B2

(12) United States Patent
Li et al.

(10) Patent No.: US 11,923,436 B2

(45) Date of Patent: Mar. 5, 2024

(54) SOURCE/DRAIN STRUCTURE FOR SEMICONDUCTOR DEVICE

(71) Applicant: Taiwan Semiconductor Manufacturing Co., Ltd., Hsinchu (TW)

(72) Inventors: Chen-Heng Li, Hsinchu (TW); Yi-Jing Li, Hsinchu (TW); Chia-Der Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 32 days.

(21) Appl. No.: 17/220,598

(22) Filed: Apr. 1, 2021

(65) Prior Publication Data

US 2022/0045198 A1 Feb. 10, 2022

Related U.S. Application Data

(60) Provisional application No. 63/062,719, filed on Aug. 7, 2020.

(51) Int. Cl.

*H01L 29/66* (2006.01)
*H01L 21/8234* (2006.01)
*H01L 29/78* (2006.01)

(52) U.S. Cl.

CPC .................. *H01L 29/66795* (2013.01); *H01L 21/823412* (2013.01); *H01L 21/823418* (2013.01); *H01L 21/823431* (2013.01); *H01L 29/7851* (2013.01)

(58) Field of Classification Search

None

See application file for complete search history.

(56) References Cited

U.S. PATENT DOCUMENTS 9,105,490 B2 8/2015 Wang et al.
9,236,267 B2 1/2016 De et al.
9,236,300 B2 1/2016 Liaw
9,406,804 B2 8/2016 Huang et al.
9,443,769 B2 9/2016 Wang et al.
9,520,482 B1 12/2016 Chang et al.
9,548,366 B1 1/2017 Ho et al.
9,576,814 B2 2/2017 Wu et al.
9,831,183 B2 11/2017 Lin et al.
9,859,386 B2 1/2018 Ho et al.
2017/0033220 A1* 2/2017 Fung .................. H01L 29/7849
2019/0165175 A1* 5/2019 More ................ H01L 29/66795

* cited by examiner

*Primary Examiner* — Joseph C. Nicely
*Assistant Examiner* — Lamont B Koo
(74) *Attorney, Agent, or Firm* — Sterne, Kessler, Goldstein & Fox P.L.L.C.

(57) ABSTRACT

The present disclosure describes a semiconductor structure and a method for forming the same. The method can include forming a fin structure over a substrate. The fin structure can include a channel layer and a buffer layer between the channel layer and the substrate. The method can further include forming a recess structure in the channel layer. The recess structure can include a bottom surface over the buffer layer. The method can further include forming a first epitaxial layer over the bottom surface of the recess structure. The first epitaxial layer can include a first atomic concentration of germanium. The method can further include forming a second epitaxial layer over the first epitaxial layer. The second epitaxial layer can include a second atomic concentration of germanium greater than the first atomic concentration of germanium.

20 Claims, 15 Drawing Sheets

SOURCE/DRAIN STRUCTURE FOR SEMICONDUCTOR DEVICE

CROSS-REFERENCE TO RELATED APPLICATION

This application claims the benefit of U.S. Provisional Patent Application No. 63/062,719, titled "Source/Drain Structure for Strained Channel Transistors," which was filed on Aug. 7, 2020 and is incorporated herein by reference in its entirety.

BACKGROUND

Advances in semiconductor technology has increased the demand for field effect transistors (FETs) with higher performance for faster processing systems. To meet this demand, it is important to reduce the FET's channel resistance to minimize transistor delay (e.g., resistive-capacitive (RC) delay). An underlap between the FET's gate terminal and the FET's source/drain terminal can contribute to the FET's channel resistance.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
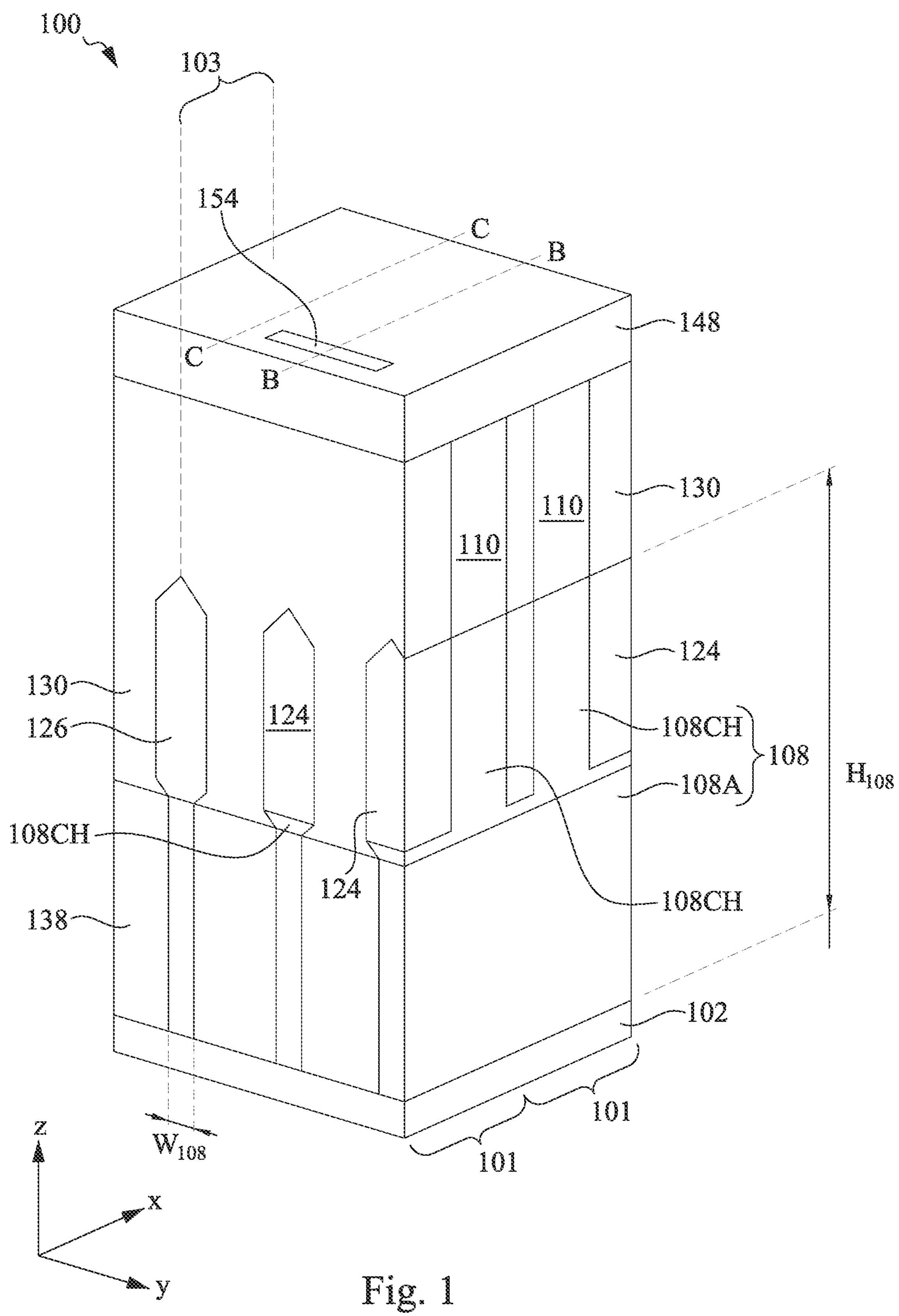
FIG. 1 illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, 4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (ICs) having higher performance for high-speed applications. In the course of the IC evolution, the transistor structure has adopted a lattice-mismatched source/drain (S/D) region to induce a strain in the transistor's channel to boost the transistor's channel mobility. To further boost the transistor's channel mobility, the transistor structure can adopt a layer of high mobility material, such as a silicon germanium (SiGe) layer, to form the transistor channel on a buffer layer and/or on a substrate. Further, the S/D region's volume needs to be increased to reduce the transistor's parasitic resistance and the contact resistance to boost the transistor's performance. However, the S/D region with the increased volume can penetrate through the layer of high mobility material and deeply protrude into the underlying buffer layer and/or the underlying substrate to decrease the induced strain in the transistor's channel, thus degrading the transistor's performance and speed.

To address the aforementioned challenges, this disclosure is directed to a fabrication method and structures that provide an increased strain for a transistor's channel. The transistor can be an p-channel field effect transistor (PFET) with a channel layer epitaxially grown on a substrate. The epitaxially-grown channel layer can be a layer of high mobility material, such as a SiGe layer, that is different from the substrate, such as a silicon (Si) substrate. The transistor can further include a gate structure formed over a first portion (e.g., the transistor's channel region) of the epitaxially-grown channel layer and a p-type S/D region that protrudes into a second portion of the epitaxially-grown channel layer. The p-type S/D region can be made of different material from the epitaxially-grown channel layer to induce a strain in the transistor's channel region. For example, the p-type S/D region can include a SiGe layer that has a greater germanium atomic concentration than the epitaxially-grown channel layer. Therefore, the S/D region can induce a strain in the transistor's channel region to boost the transistor's channel mobility. Further, the S/D region does not cutting through the second portion of the epitaxially-grown channel layer. For example, the S/D region's bottom surface can be above the epitaxially-grown channel layer's bottom surface. Therefore, the strain formed by the lattice constant discrepancy between the S/D region and the epitaxially-grown channel layer can be maintained in the transistor's channel region. Accordingly, a benefit of the present disclosure, among others, is to avoid decreasing the above-noted induced strain, thus improving transistor's performance and speed.

Figure 2:
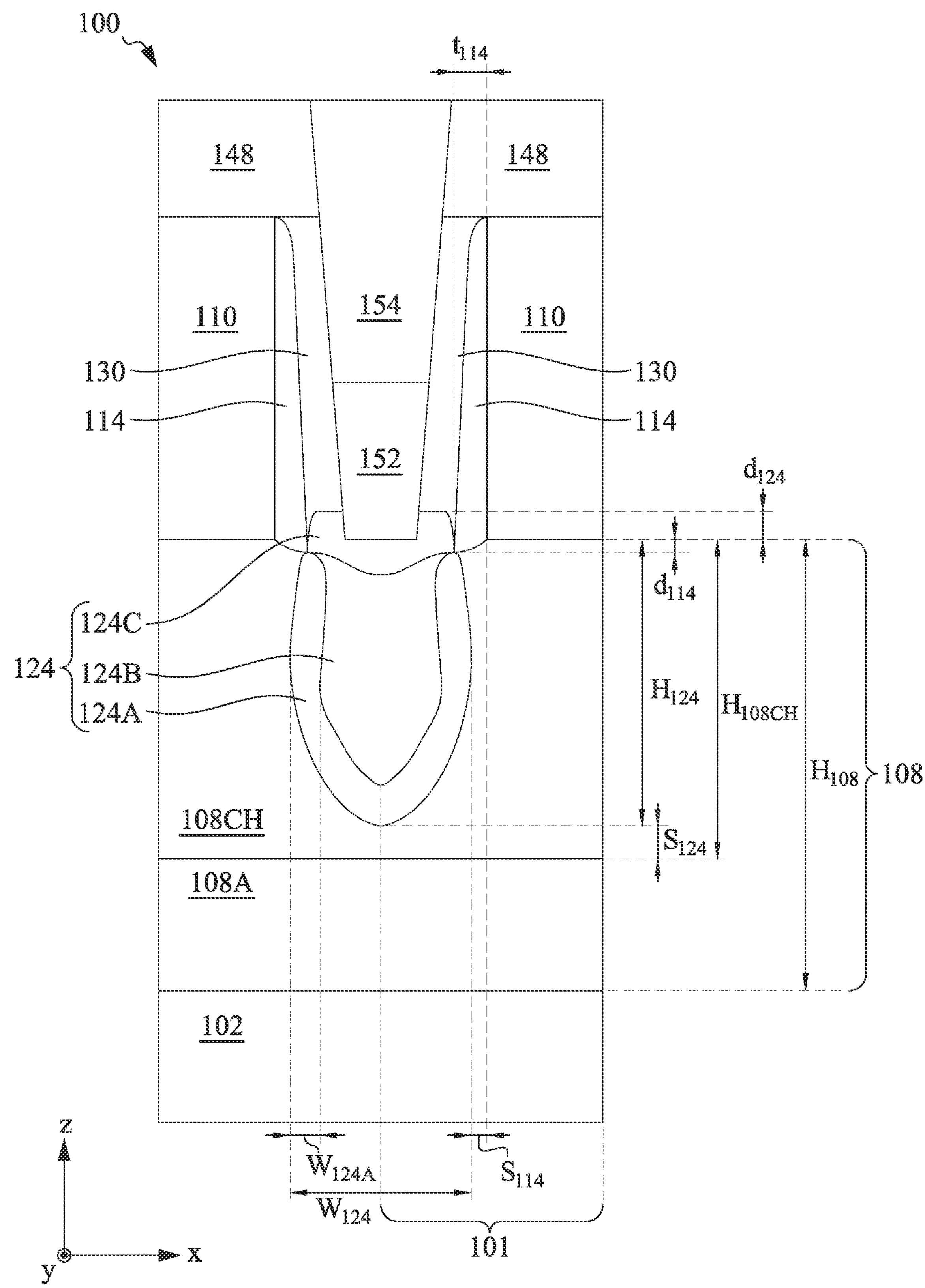
FIGS. 2-5 illustrate cross-sectional views of a semiconductor device, according to some embodiments.
Figure 3:
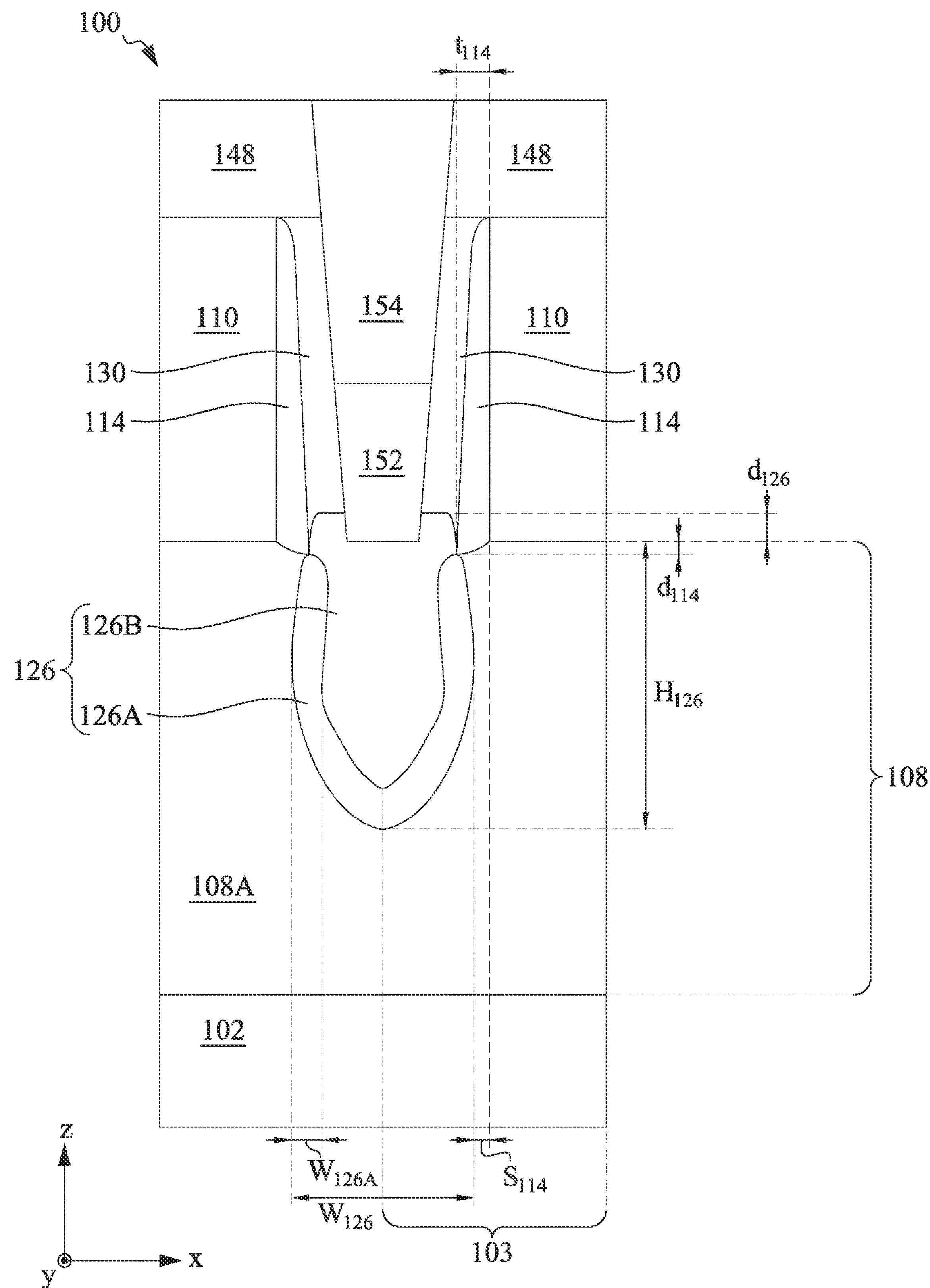
Figure 4:
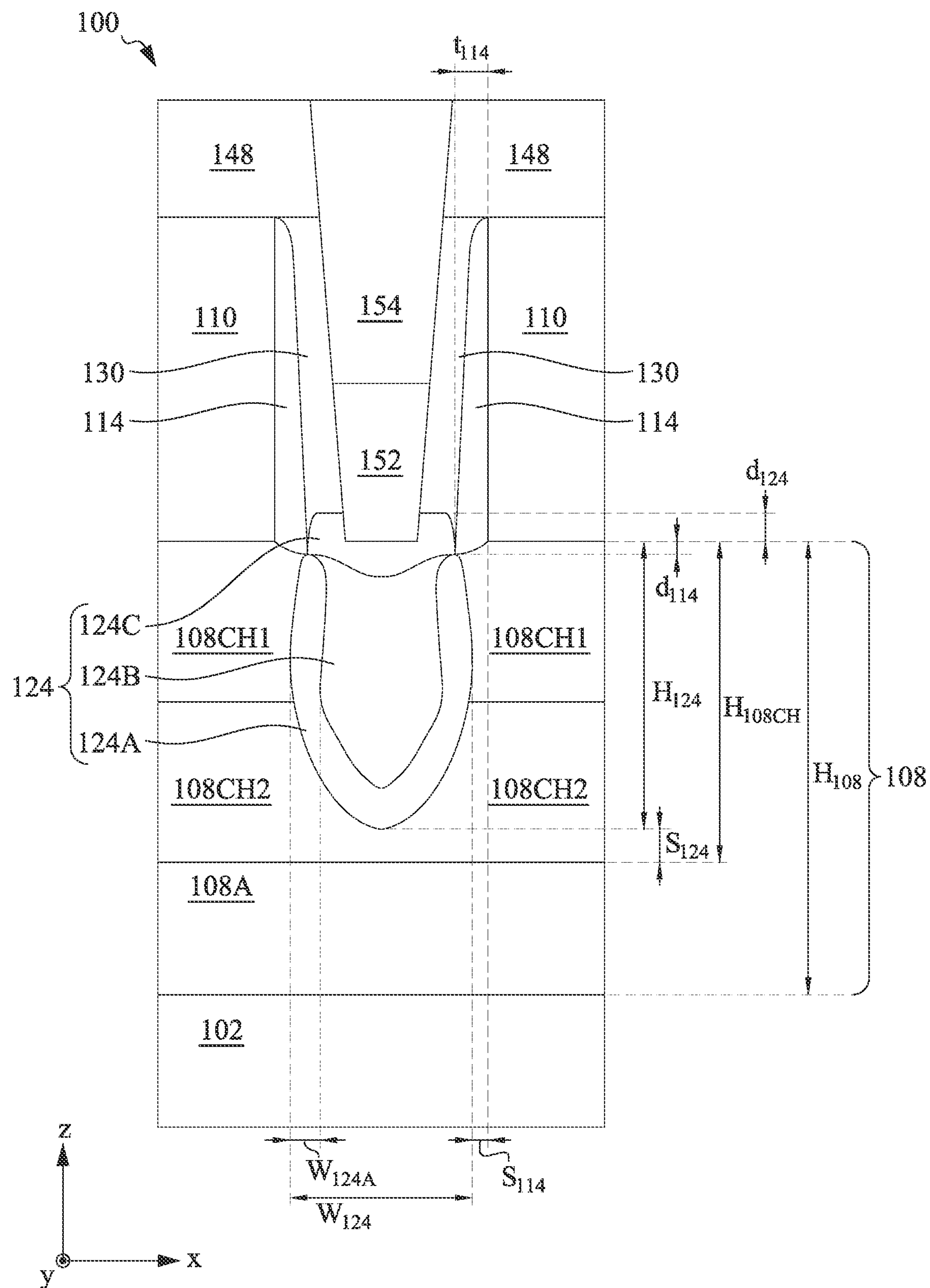
Figure 5:
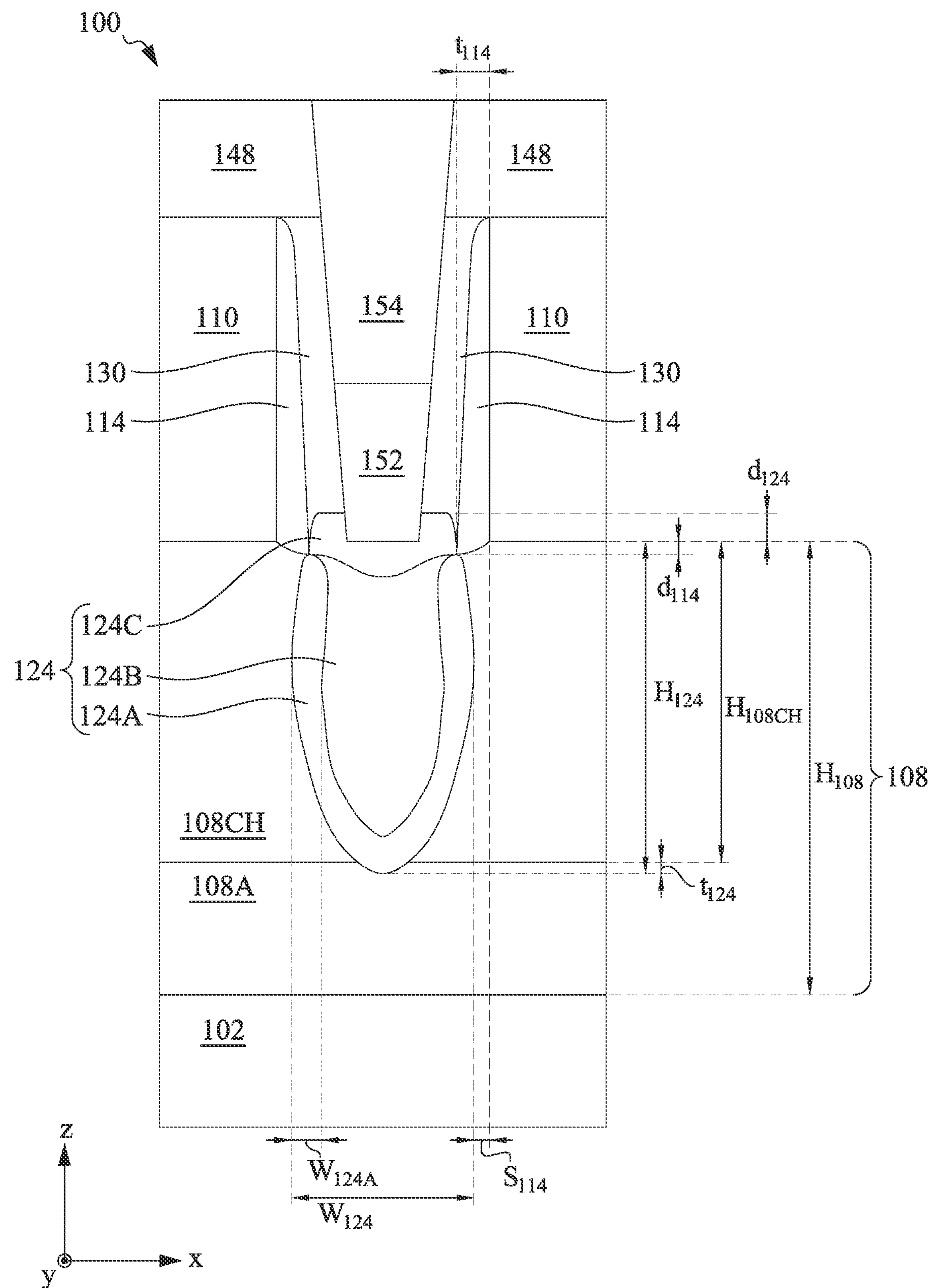

A semiconductor device 100 having multiple field effect transistors (FETs) 101 and 103 formed over a substrate 102 is described with reference to FIGS. 1-5, according to some embodiments. FETs 101 and FETs 103 can be formed over different portions of substrate 102. In some embodiments, FET 101 can be a PFET, and FET 103 can be an n-channel field effect transistor (NFET). Semiconductor device 100 can be included in a microprocessor, memory cell, or other integrated circuit (IC). FIG. 1 illustrates an isometric view of semiconductor device 100, according to some embodiments. FIGS. 2, 4, and 5 illustrate cross-sectional views along a source/drain (S/D) region (e.g., line B-B of FIG. 1) of semiconductor device 100, according to some embodiments. FIG. 3 illustrates a cross-sectional view along a source/drain (S/D) region (e.g., line C-C of FIG. 1) of semiconductor device 100, according to some embodiments. The discussion of elements in FIGS. 1-5 with the same annotations applies to each other, unless mentioned otherwise. Semiconductor device 100 can be included in a microprocessor, memory cell, or other integrated circuit (IC). Also, even though FETs 101 and 103 shown in FIGS. 1-5 are fin field effect transistors (finFETs), FETs 101 and 103 can be gate-all-around (GAA) FETs, according to some embodiments.

Referring to FIG. 1, substrate 102 can be a semiconductor material, such as silicon. In some embodiments, substrate 102 can include a crystalline silicon substrate (e.g., wafer). In some embodiments, substrate 102 can include (i) an elementary semiconductor, such as Si and germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), SiGe, gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, the term "p-type" defines a structure, layer, and/or region as being doped with p-type dopants, such as boron. In some embodiments, the term "n-type" defines a structure, layer, and/or region as being doped with n-type dopants, such as arsenic. In some embodiments, substrate 102 can be doped with p-type dopants (e.g., boron, indium, aluminum, or gallium) or n-type dopants (e.g., phosphorus or arsenic). In some embodiments, different portions of substrate 102 can be doped with different dopants.

Each of FETs 101 and 103 can include a fin structure 108 formed over substrate 102 with a suitable width $W_{108}$, such as from about 5 nm to about 50 nm, and a suitable height $H_{108}$, such as from about 100 nm to about 200 nm. Fin structure 108 can extend in an x-direction and being traversed by a gate structure 110 in a y-direction. The portion of FET 101's fin structure 108 traversed by gate structure 110 can be FET 101's channel region. Similarly, the portion of FET 103's fin structure 108 traversed by gate structure 110 can be FET 103's channel region. In some embodiments, FET 101 can be a p-channel FET (PFET), where FET 101's channel region can conduct hole carriers. In some embodiments, FET 103 can be an n-channel FET (NFET), where FET 101's channel region can conduct electron carriers. In some embodiments, FET 101 and/or FET 103 can include multiple fin structures 108 extending along a first horizontal direction (e.g., in the x-direction) and gate structure 110 traversing through the multiple fin structures 108 along a second horizontal direction (e.g., in the y-direction). In some embodiments, multiple FETs 101 and/or FET 103 can have a common gate structure 110.

Referring to FIGS. 2 and 3, fin structure 108 can include a buffer layer 108A disposed on substrate 102. Buffer layer 108A can be made of materials similar to substrate 102 to ensure channel regions of FETs 101 and 103 being crystalline defect-free. In some embodiments, buffer layer 108A can be made of a semiconductor material that has a lattice mismatch less than about 0.5% compared to substrate 102. In some embodiments, the difference of germanium atomic concentrations between buffer layer 108A can substrate 102 can be from about 0 to about 0.2%, such as from about 0 to about 0.1 and from about 0 to about 0.05. If the difference of germanium atomic concentrations between buffer layer 108A can substrate 102 is greater than the above-noted upper limits, channel regions of FET 101 and/or FET 103 may induce embedded crystalline dislocations, thus degrading the reliability of FET 101 and/or FET 103. In some embodiments, buffer layer 108A and substrate 102 can be made of an identical material, such as Si. In some embodiments, buffer layer 108A for FET 101 can have different doping type (e.g., n-type or p-type) from buffer layer 108A for FET 103.

Referring to FIG. 2, in some embodiments, fin structure 108 of FET 101 can further include a channel layer 108CH disposed on buffer layer 108A. To boost FET 101's channel mobility, channel layer 108CH can have a greater carrier mobility (e.g., hole mobility and/or electron mobility) than buffer layer 108A and substrate 102. In some embodiments, substrate 102, buffer layer 108A, and channel layer 108CH can include silicon and/or germanium, where channel layer 108CH can have a greater germanium atomic concentration than buffer layer 108A and substrate 102. In some embodiments, channel layer 108CH can have a germanium atomic concentration from about 0.2 to about 0.3. If channel layer 108CH's germanium atomic concentration is less than the above-noted lower limit, FET 101 may not have sufficient channel mobility, thus failing to meet the FET 101's performance requirements, such as the requirement of a peak drive current being greater than 1 mA/μm. If channel layer 108CH's germanium atomic concentration is greater than the above-noted upper limit, the lattice mismatch between channel layer 108CH and substrate 102 may induce crystalline dislocations in channel layer 108CH, thus failing to meet FET 101's reliability standards, such as failing to meet FET 101's breakdown voltage requirements. In some embodiments, the difference between channel layer 108CH and substrate 102 and/or the difference between channel layer 108CH and buffer layer 108A can be from about 0.2 to about 0.3. If the difference between channel layer 108CH and substrate 102 and/or the difference between channel layer 108CH and buffer layer 108A is less than the above-noted lower limit, FET 101 may not have sufficient channel mobility, thus failing to meet FET 101's performance requirements, such as the requirement of a peak drive current being greater than 1 mA/μm. If the difference between channel layer 108CH and substrate 102 and/or the difference between channel layer 108CH and buffer layer 108A is greater than the above-noted upper limit, the lattice mismatch between channel layer 108CH and substrate 102 may induce crystalline dislocations in channel layer 108CH, thus failing to meet FET 101's reliability standards, such as failing to meet FET 101's breakdown voltage requirements.

Channel layer 108CH can have a suitable thickness $H_{108CH}$, such as from about 50 nm to about 65 nm, to optimize FET 101's performance. In some embodiments, a ratio of channel layer 108CH's thickness $H_{108CH}$ to fin structure 108's height $H_{108}$ can be from about 90% to about 98%. If the ratio of channel layer 108CH's thickness $H_{108CH}$ to fin structure 108's height $H_{108}$ is less than the above-noted lower limit, FET 101 may not have sufficient channel mobility, thus failing to meet FET 101's performance requirements, such as the requirement of a peak drive current being greater than 1 mA/μm. If the ratio of channel layer 108CH's thickness $H_{108CH}$ to fin structure 108's height $H_{108}$ is greater than the above-noted upper limit, channel layer 108CH may induce crystalline dislocations, thus failing to meet FET 101's reliability standards.

In some embodiments, referring to FIG. 4, channel layer 108CH can be a multilayer structure. For example, as shown in FIG. 4, channel layer 108CH can include a first channel layer 108CH1 and a second channel layer 108CH2 disposed between first channel layer 108CH1 and buffer layer 108A. Each layer (e.g., first channel layer 108CH1 and second channel layer 108CH2) of multilayered channel layer 108CH can have a germanium atomic concentration greater than buffer layer 108A and/or substrate 102. For example, first channel layer 108CH1 can have a germanium atomic concentration from about 0.2 to about 0.3, and second channel layer 108CH2 can have a germanium atomic concentration from about 0.26 to about 0.4, where buffer layer 108A and/or substrate 102 can have a germanium atomic concentration less than about 20%. In some embodiments, second channel layer 108CH2 can have a greater germanium atomic concentration than first channel layer 108CH1 to further increase the strain in FET 101's channel region, thus further boosting FET 101's speed and performance.

Referring to FIGS. 1 and 2, gate structure 110 can be multi-layered structures that wraps around portions of fin structure 108. For example, gate structure 110 can wrap FET 101's channel region and/or FET 103's channel region (e.g., portions of fin structure 108 wrapped by gate structure 110) to modulate a conductivity of channel layer 108CH of FET 101 and/or FET 103. In some embodiments, gate structure 110 can be referred to as gate-all-around (GAA) structures, where FETs 101 and 103 can be referred to as a GAA FETs. Gate structure 110 can have a suitable gate length, such as from about 10 nm to about 100 nm, in the x-direction to meet a gate pitch requirement associated with an IC's technology node (e.g., 7 nm node, 5 nm node, 3 nm node, etc.).

Gate structure 110 can include a gate dielectric layer (not shown in FIGS. 1-5) and a gate electrode (not shown in FIG. 1-5) disposed on the gate dielectric layer. The gate dielectric layer can be wrapped around fin structure 108, hence electrically isolating fin structure 108 from the gate electrode. The gate dielectric layer can be disposed between the gate electrode and S/D regions 124 (discussed below) to prevent electrical shorting in between. The gate dielectric layer can include any suitable dielectric material, such as silicon oxide, silicon nitride, silicon oxynitride, and a metal oxide (e.g., aluminum oxide and hafnium oxide). The gate dielectric layer can have a thickness ranging from about 1 nm to about 5 nm. The gate electrode can be a gate terminal of FET 101 and/or FET 103. Other materials and thicknesses for the gate dielectric layers are within the spirit and scope of this disclosure.

The gate electrode can include metal stacks that wrap about fin structure 108. In some embodiments, the gate electrode can include titanium (Ti), tantalum (Ta), aluminum (Al), copper (Cu), tungsten (W), manganese (Mn), zirconium (Zr), ruthenium (Ru), molybdenum (Mo), cobalt (Co), nickel (Ni), silver (Ag), nickel silicide (NiSi), cobalt silicide (CoSi), titanium nitride (TiN), tantalum nitride (TaN), tantalum silicon nitride (TaSiN), tantalum carbon nitride (TaCN), titanium aluminum (TiAl), titanium aluminum nitride (TiAlN), tungsten nitride (WN), tantalum carbide (TaC), titanium carbide (TiC), titanium aluminum carbide (TiAlC), or tantalum aluminum carbide (TaAlC). Other materials for the gate electrode are within the spirit and scope of this disclosure.

Semiconductor device 100 can further include a gate spacer 114 disposed on gate structure 110's sidewalls. Gate spacer 114 can separate gate structure 110 from semiconductor device 100's S/D contact structure (e.g., layer of conductive material 154; discussed below). Gate spacer 114 can include a suitable insulating material, such as silicon oxide, silicon nitride, and a metal oxide. In some embodiments, gate spacer 114 can have a thickness $t_{114}$ ranging from about 6 nm to about 10 nm. In some embodiments, gate spacer 114 can have a slanted bottom surface. For example, an edge of gate spacer 114 that is proximate to gate structure 110 can be higher than another edge of gate spacer 114 by a separation $d_{114}$, such as from about 0 nm to about 6 nm. Other materials and dimensions for gate spacer 114 are within the spirit and scope of this disclosure.

Semiconductor device 100 can further include a shallow trench isolation (STI) regions 138 that provide electrical isolation for fin structure 108. For example, STI regions 138 can electrically isolate fin structure 108 from another fin structure 108 (not shown in FIG. 1) formed in semiconductor device 100. Also, STI regions 138 can provide electrical isolation between FETs 101/103 and neighboring active and passive elements (not shown in FIG. 1) integrated with or deposited on substrate 102. STI regions 138 can include one or more layers of dielectric material, such as a nitride layer, an oxide layer disposed on the nitride layer, and an insulating layer disposed on the nitride layer. In some embodiments, an insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, and/or other suitable insulating materials. Other materials for STI region 138 are within the spirit and scope of this disclosure.

Semiconductor device 100 can further include an interlayer dielectric (ILD) layer 130 disposed over fin structure 108 to provide an electrical insulation between adjacent fin structures 108. In some embodiments, ILD layer 130 can provide an electrical insulation between gate structure 110 and contact structure (e.g., a layer of conductive material 154). ILD layer 130 can include a suitable insulating material, such as a flowable dielectric material (e.g., flowable silicon oxide, flowable silicon nitride, flowable silicon oxynitride, flowable silicon carbide, or flowable silicon oxycarbide) and a dielectric material (e.g., silicon oxide or silicon nitride). Other materials for ILD layer 130 are within the spirit and scope of this disclosure.

Referring to FIGS. 2, 4, and 5, semiconductor device 100 can further include a S/D region 124 formed over FET 101's fin structure 108 and over opposite sides (e.g., along an x-direction) of gate structure 110. S/D region 124 can include an epitaxially-grown semiconductor layer stack. The epitaxially-grown semiconductor layer stack of S/D region 124 can include (i) an elemental semiconductor material, such as Ge and Si; (ii) a compound semiconductor material, such as GaAs and AlGaAs; or (iii) a semiconductor alloy, such as SiGe and GaAsP. Further, the epitaxially-grown semiconductor layer stack of S/D region 124 can include a semiconductor layer with a lattice constant greater than channel layer 108CH to provide a compressive strain for FET 101's channel region. For example, the epitaxially-grown semiconductor material of S/D region 124 can include a SiGe layer with a germanium atomic concentration greater than channel layer 108CH. In some embodiments, the epitaxially-grown semiconductor layer stack of S/D region 124 can be doped with p-type dopants, such as boron, indium, aluminum, gallium, zinc, beryllium, and magnesium.

S/D region 124 can have a suitable horizontal (e.g., in the x-direction) width $W_{124}$, such as from about 15 nm to about 30 nm. In some embodiments, S/D region 124 can further horizontally (e.g., in the x-direction) extend towards FET 101's channel region to reduce FET 101's channel resistance. For example, S/D region 124 can horizontally (e.g., in the x-direction) extend under gate spacer 114 to reduce FET 101's resistance. Therefore, a horizontal (e.g., in the x-direction) separation $S_{114}$ between S/D region 124 and gate structure 110 can be less than gate spacer 114's thickness $t_{114}$. In some embodiments, separation $S_{114}$ can be from about 2 nm to about 6 nm. If separation $S_{114}$ is less than the above-noted lower limit, FET 101 may be susceptible to short channel effects. If separation $S_{114}$ is greater than the above-noted lower limit, FET 101 may be susceptible to an increased resistance.

S/D region 124 can vertically (e.g., in the z-direction) extend above fin structure 108's top surface by a suitable vertical (e.g., in the z-direction) dimension $d_{124}$, such as from about 4 nm to about 10 nm. If vertical dimension $d_{124}$ is less than the above-noted lower limit, capping layer 124C (discussed below) may have an insufficient volume for forming silicide layer 152, thus increasing FET 101's contact resistance. If vertical dimension $d_{124}$ is greater than the above-noted upper limit, the parasitic capacitance between S/D region 124 and gate structure 110 may be increased, thus increasing FET 101's speed.

S/D region 124 can vertically (e.g., in the z-direction) protrude into fin structure 108 by a vertical (e.g., in the z-direction) dimension $H_{124}$ to enlarge S/D region 124's volume to reduce FET 101's resistance. In some embodiments, for FET 101 with a high mobility requirement (e.g., requirement of hole mobility greater than about 300 $cm^2$/Vs), S/D region 124 does not penetrate through channel layer 18CH in order to provide sufficient strain to boost mobility at FET 101's channel region. For example, as shown in FIG. 2, vertical dimension $H_{124}$ can be less than channel layer 108CH's thickness $H_{108CH}$, such that S/D region 124's bottom surface can be vertically (e.g., in the z-direction) above channel layer 108CH's bottom surface by a vertical (e.g., in the z-direction) separation $S_{124}$. In some embodiments, a ratio of vertical separation $S_{124}$ to channel layer 108CH's thickness $H_{108CH}$ can be from about 0.05 to about 0.2. If the ratio of vertical separation $S_{124}$ to channel layer 108CH's thickness $H_{108CH}$ is less than the above-noted lower limit, S/D region 124 may not induce sufficient strain in FET 101's channel region, thus failing to meet FET 101's high mobility requirement. If the ratio of vertical separation $S_{124}$ to channel layer 108CH's thickness $H_{108CH}$ is greater than the above-noted upper limit, S/D region 124 may not have sufficient volume to reduce FET 101's resistance, thus degrading FET 101's speed. In some embodiments, as shown in FIG. 3, channel layer 108CH can be a multilayered stack (e.g., first channel layer 108CH1 and second channel layer 108CH2), where S/D region 124 can penetrate through channel layer 108CH's upper portion (e.g., formed through first channel layer 108CH 1) and partially protrude into channel layer 108CH's lower portion (e.g., formed in second channel layer 108CH2) with S/D region 124's bottom surface being above second channel layer 108CH2's bottom surface by vertical separation $S_{124}$.

In some embodiments, for FET 101 with a low resistance requirement (e.g., requirement of transistor external resistance less than about 3500Ω·μm), S/D region 124's bottom can be substantially coplanar with 108CH's bottom surface in order to enlarge S/D region 124's volume to provide an reduced resistance for FET 101. For example, as shown in FIG. 5, vertical dimension $H_{124}$ can be substantially equal to channel layer 108CH's thickness $H_{108CH}$. In some embodiments, S/D region 124 can be formed through channel layer 108CH by a vertical (e.g., in the z-direction) penetration depth $t_{124}$, where a ratio of penetration depth $t_{124}$ to channel layer 108CH's thickness $H_{108CH}$ can be from about 0 to about 0.03. If the ratio of penetration depth $t_{124}$ to channel layer 108CH's thickness $H_{108CH}$ is less than the above-noted lower limit, S/D region 124 may not have sufficient volume to reduce FET 101's resistance, thus failing to meet FET 101's low resistance requirement. If the ratio of penetration depth $t_{124}$ to channel layer 108CH's thickness $H_{108CH}$ is greater than the above-noted upper limit, S/D region 124 may not induce sufficient strain in FET 101's channel region, thus degrading FET 101's speed.

As previously discussed, S/D region 124 can include an epitaxially-grown semiconductor layer stack. As shown in FIG. 2, S/D region can include a first layer 124A formed in channel layer 108CH. First layer 124A can be made of an epitaxially-grown semiconductor material, such as a compound semiconductor material (e.g., SiGe). In some embodiments, first layer 124A can be made of SiGe with a suitable germanium atomic concentration, such as from about 20% to about 30%, to reduce crystal defects of second layer 124B and capping layer 124C (discussed below). First layer 124A can be doped with p-type dopants, such as boron, indium, aluminum, gallium, zinc, beryllium, and magnesium. In some embodiments, first layer 124A can be doped with p-type dopants having a doping concentration less than $5\times10^{20}/cm^3$, such as from about $5\times10^{19}/cm^3$ to about $5\times10^{20}/cm^3$, to mitigate short channel effects of FET 101. In some embodiments, first layer 124A can have a horizontal (e.g., in the x-direction) dimension $W_{124A}$, where a ratio of first layer 124A's horizontal dimension $W_{124A}$ to S/D region 124's horizontal width $W_{124}$ can be from about 0.15 to about 0.25. If the ratio of first layer 124A's horizontal dimension $W_{124A}$ to S/D region 124's horizontal width $W_{124}$ is less than the above-noted lower limit, second layer 124B (discussed below) may have a greater crystalline defect density, thus degrading FET 101's reliability standards, such as failing to meet FET 101's breakdown voltage requirements. If the ratio of first layer 124A's horizontal dimension $W_{124A}$ to S/D region 124's horizontal width $W_{124}$ is greater than the above-noted upper limit, S/D region 124 may not provide sufficient strain to boost FET 101's mobility.

S/D region 124 can further include a second layer 124B formed over first layer 124A. Second layer 124B can be made of a compound semiconductor, such as SiGe. In some embodiments, channel layer 108CH, first layer 124A, and second layer 124B can be made of SiGe, where second layer 124B can have a greater germanium atomic concentration than channel layer 108CH and first layer 124A to provide sufficient strain to enhance FET 101's channel mobility. For example, second layer 124B can be made of SiGe with a germanium atomic concentration from about 50% to about 55%. Second layer 124B can be doped with p-type dopants, such as boron, indium, aluminum, gallium, zinc, beryllium, and magnesium. Second layer 124B can be doped with dopants having a greater doping concentration than first layer 124A to provide a low contact resistance for FET 101. For example, second layer 124B can be doped with p-type dopants having a doping concentration greater than or substantially equal to about $5\times10^{20}/cm^3$, such as from about $5\times10^{21}/cm^3$ to about $1\times10^{21}/cm^3$, to provide a low contact resistance for FET 101.

S/D region 124 can further include a capping layer 124C formed over second layer 124B. In some embodiments, capping layer 124C can be formed over and in contact with first layer 124A. In some embodiments, capping layer 124C's top surface can be S/D region 124's top surface. In some embodiments, capping layer 124C's top surface can include (111) or (100) crystal planes. Capping layer 124C can be made of a compound semiconductor, such as SiGe. In some embodiments, second layer 124B and capping layer 124C can be made of SiGe, where capping layer 124C can have a germanium atomic concentration less than or substantially equal to second layer 124B to provide sufficient silicon atoms to form a silicide layer 152. For example, capping layer 124C can be made of SiGe with the germanium atomic concentration from about 15% to about 25%. Capping layer 124C can be doped with p-type dopants, such as boron, indium, aluminum, gallium, zinc, beryllium, and magnesium. Capping layer 124C can be doped with any suitable doping concentration to provide a low contact resistance for FET 101. In some embodiments, capping layer 124C can be doped with p-type dopants having a doping concentration from about $5\times10^{20}/cm^3$ to about $2\times10^{21}/cm^3$ to provide a low contact resistance for FET 101.

Referring to FIG. 3, semiconductor device 100 can further include a S/D region 126 formed over FET 103's fin structure 108 (e.g., formed over buffer layer 108A) and over opposite sides (e.g., along an x-direction) of gate structure 110. S/D region 126 can be made of a semiconductor material, such as an element semiconductor material (e.g., Si or Ge). In some embodiments, FET 103 can be an NFET, where S/D region 126 can be doped with n-type dopants (e.g., phosphorus, arsenic, sulfur, or selenium) to provide electron carriers for FET 103. In some embodiments, FET 103 can be an NFET, where S/D region 126 can be made of an n-type layer stack of epitaxially-grown semiconductor material that provides electrons to FET 101's channel region.

In some embodiments, S/D region 126 can include a first layer 126A formed over fin structure 108. First layer 126A can be made of an n-type semiconductor material (e.g., doped with n-type dopants, such as phosphorus, arsenic, sulfur, and selenium) that provides electrons to FET 103's channel region. In some embodiments, first layer 126A can be made of a semiconductor material that has a lattice constant less than or substantially equal to the lattice constant of FET 103's channel region, such that first layer 126A can induce a tensile strain in FET 103's channel region to boost FET 103's electron mobility. For example, FET 103's channel region and first layer 126A can be made of silicon. In some embodiments, FET 103's channel region can be made of silicon, and first layer 126A can be made of a semiconductor material free from germanium or free from silicon germanium (e.g., first layer 126A does not contain germanium and/or silicon germanium) to avoid inducing a compressive stress in FET 103's channel region and degrading FET 103's electron mobility.

In some embodiments, S/D region 126 can further include a second layer 126B formed over and in contact with first layer 126A. Second layer 126B can be an n-type semiconductor material (e.g., doped with n-type dopants, such as phosphorus, arsenic, sulfur, and selenium) that provides electrons to FET 103's channel region. Further, second layer 126B can reduce FET 101's contact resistance by providing high activated carriers (e.g., high electron concentrations) to FET 103's channel region. In some embodiments, second layer 126B can be made of a semiconductor material that has a lattice constant less than or substantially equal to the lattice constant of FET 103's channel region, such that second layer 126B can induce a tensile strain in FET 103's channel region to boost FET 103's electron mobility. For example, FET 103's channel region and second layer 126B can be made of silicon. In some embodiments, FET 103's channel region can be made of silicon, and second layer 126B can be made of a semiconductor material free from germanium or free from silicon germanium (e.g., second layer 126A does not contain germanium and/or silicon germanium) to avoid inducing a compressive stress in FET 103's channel region and degrading FET 103's electron mobility.

Semiconductor device 100 can further include a layer of insulating material 148 formed over gate structure 110 and ILD layer 130. Layer of insulating material 148 can electrically isolate gate structure 110 and S/D region 124 from an interconnect structure (not shown in FIGS. 1-5) formed over FETs 101 and 103. Layer of insulating material 148 can be made of any suitable insulating material, such as silicon oxide, silicon nitride, and a metal oxide. Further, layer of insulating material 148 can be made of any suitable thickness, such as from about 10 nm to about 400 nm, that can provide sufficient electrical insulation between the interconnect structures (not shown in FIGS. 1-5) and FETs 101/103. Other insulating materials and thicknesses for layer of insulating material 148 are within the scope and spirit of this disclosure.

Semiconductor device 100 can further include a silicide layer 152 protruding into S/D region 124. Silicide layer 152 can include a metal silicide material to provide a low resistance interface between layer of conductive material 154 (discussed below) and S/D region 124. For example, silicide layer 152 can be formed over and in contact with S/D region 124's top surface to provide a low resistance interface between layer of conductive material 154 and S/D region 124. In some embodiments, silicide layer 152 can be formed protruding into capping layer 124C. In some embodiments, silicide layer 152 can be formed through capping layer 124C and in contact with second layer 124B. The metal silicide material for silicide layer 152 can include titanium, cobalt, nickel, platinum, palladium, tungsten, molybdenum, tantalum, vanadium, chromium, silicon, or germanium. Other materials silicide layer 152 are within the scope and spirit of this disclosure.

Semiconductor device 100 can further include a layer of conductive material 154 formed over silicide layer 152.

Layer of conductive material 154 can have a lateral width, such as from about 5 nm to about 40 nm, to meet the fin pitch requirement determined by a technology node. Layer of conductive material 154 can include any suitable conductive material that provides low resistance between silicide layer 152 and the interconnect structure (not shown in FIGS. 1-5) formed over FETs 101/103. For example, layer of conductive material 154 can include a metallic material, such as copper, tungsten, aluminum, and cobalt. In some embodiments, layer of conductive material 154 can further include a stack of conductive materials (not shown in FIGS. 1-5), such as a conductive nitride material (e.g., titanium nitride or tantalum nitride), that can act as a diffusion barrier, an adhesion promotion layer, or a nucleation layer to embed the above-noted metallic materials in layer of insulating material 148. Other materials for layer of conductive material 154 are within the scope and spirit of this disclosure.

Figure 6:
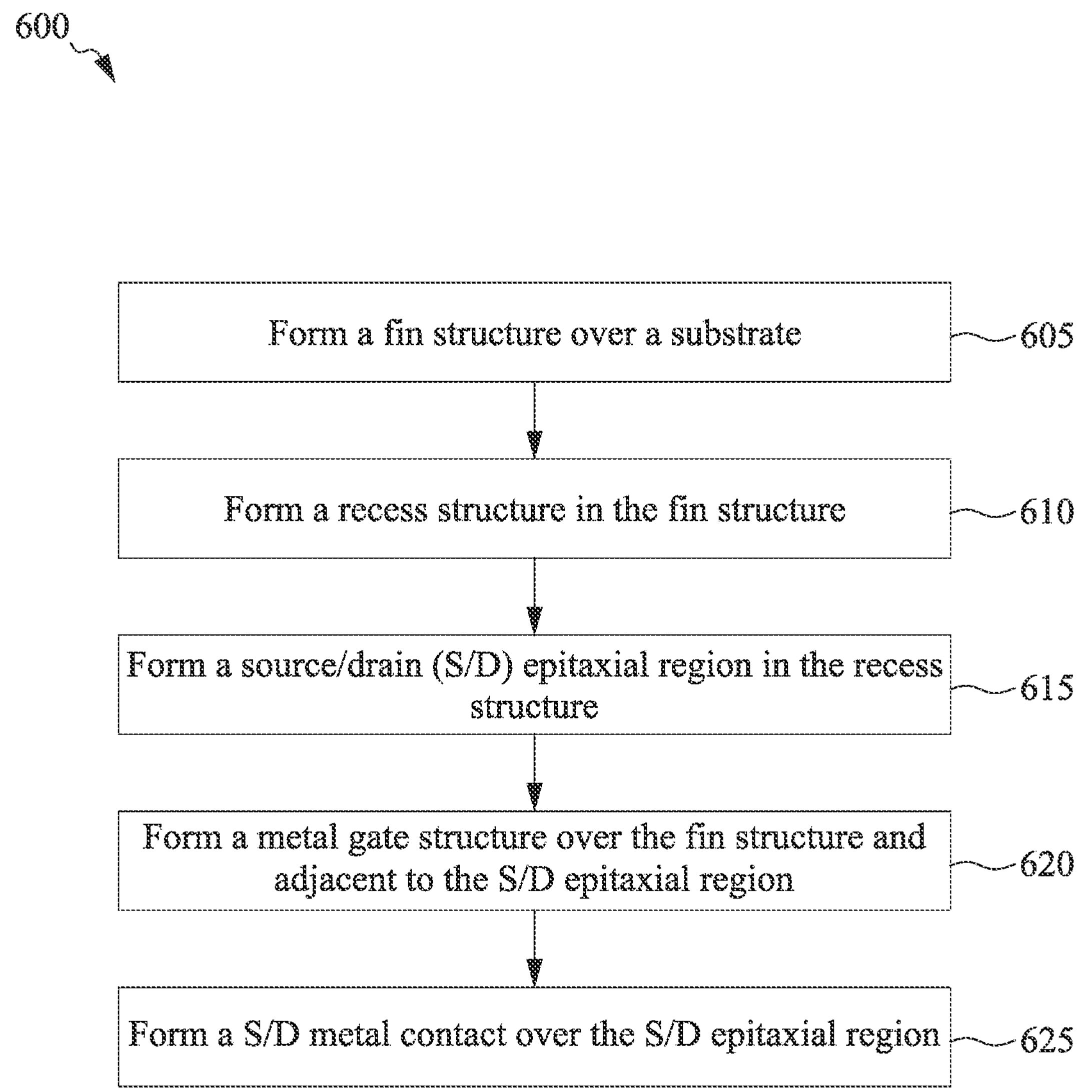
FIG. 6 illustrates a flow diagram of a method for fabricating a semiconductor device, according to some embodiments.
Figure 7:
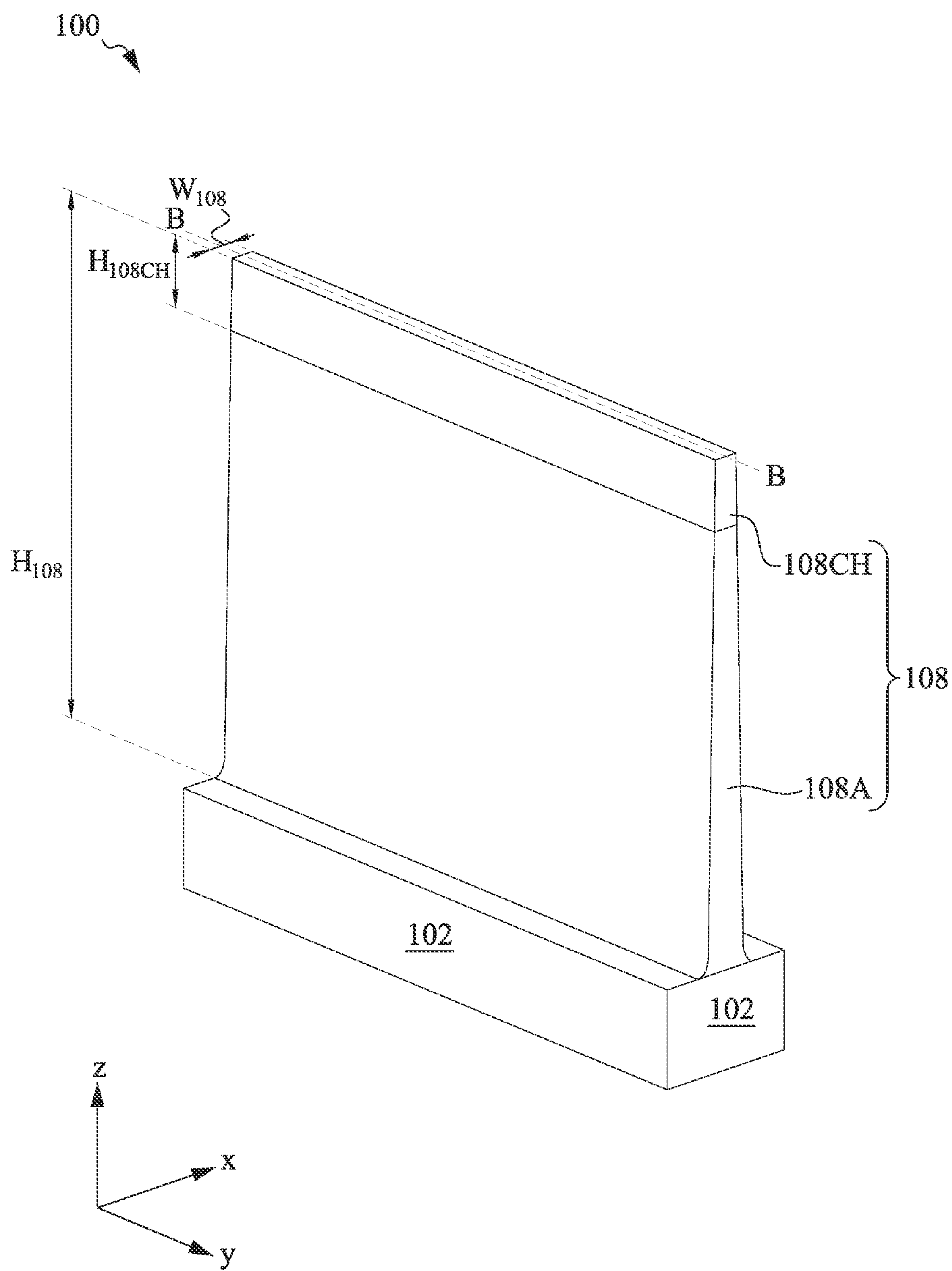
FIG. 7 illustrates an isometric view of a semiconductor device at various stages of its fabrication process, according to some embodiments.
Figure 8:
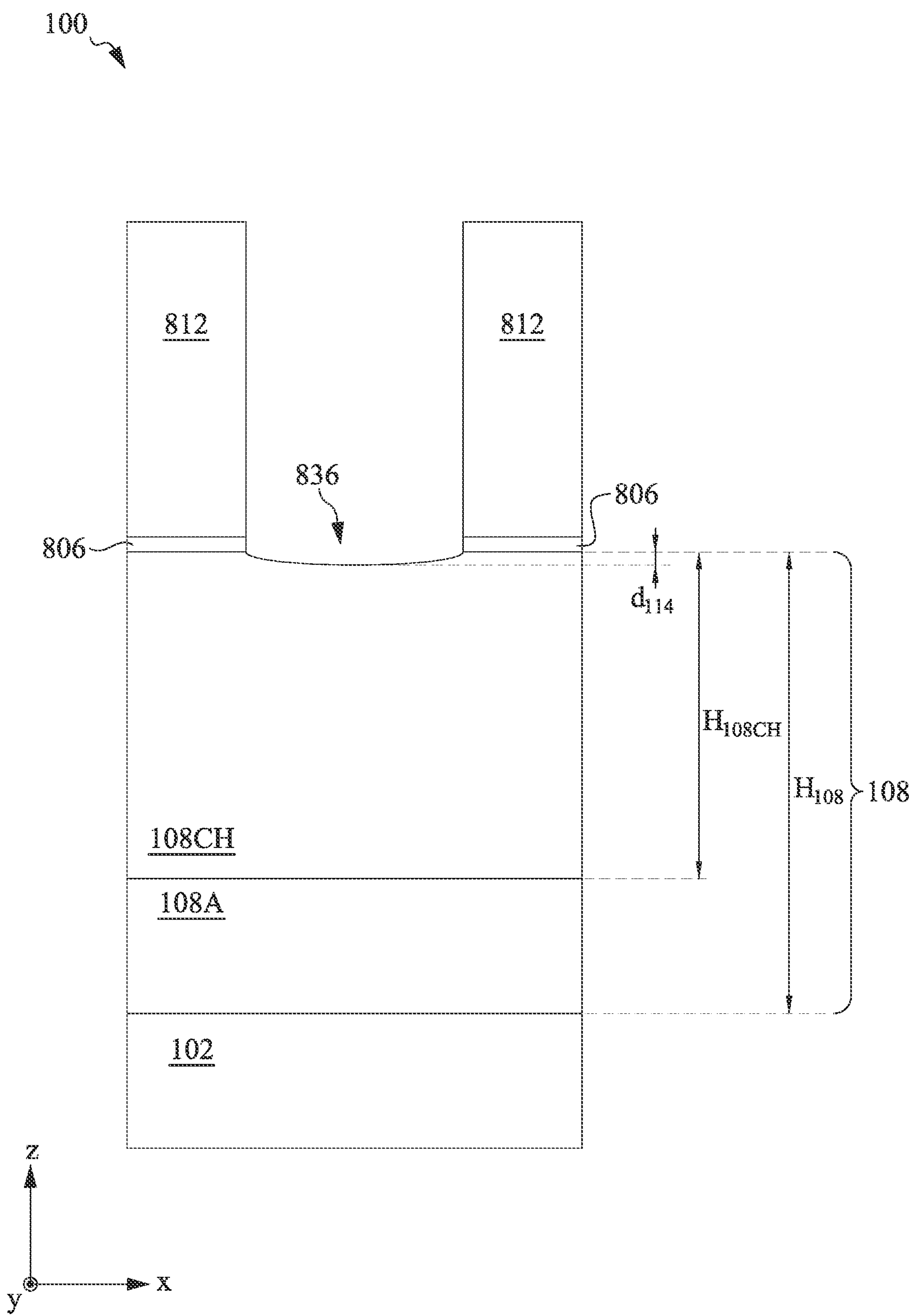
FIGS. 8-15 illustrate cross-sectional views of a semiconductor device at various stages of its fabrication process, according to some embodiments.
Figure 9:
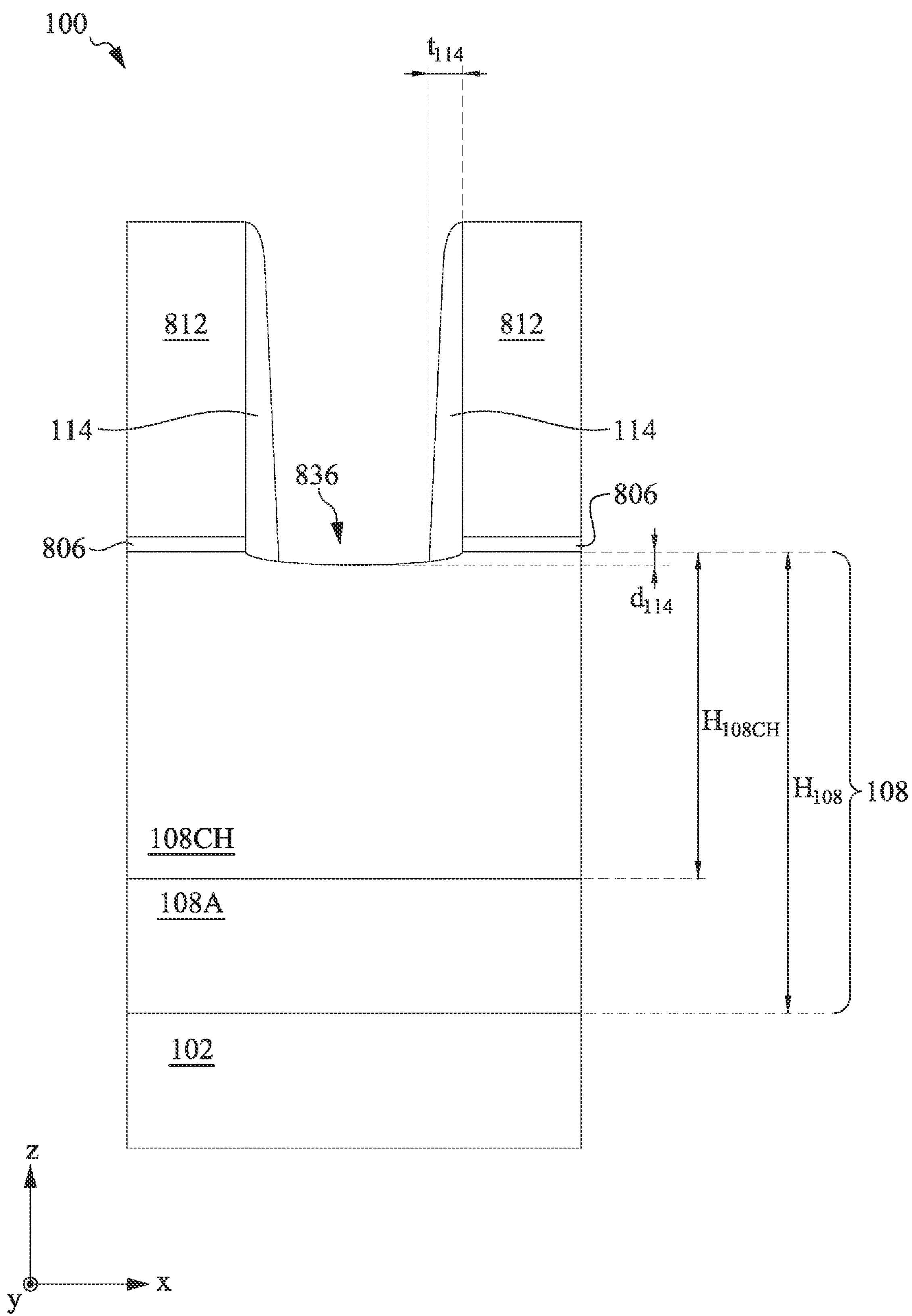

FIG. 6 is a flow diagram of a method 600 for fabricating semiconductor device 100, according to some embodiments. For illustrative purposes, the operations illustrated in FIG. 6 will be described with reference to the example fabrication process for fabricating semiconductor device 100 as illustrated in FIGS. 7-15. FIG. 7 illustrates an isometric view of semiconductor device 100 at various stages of its fabrication, according to some embodiments. FIGS. 8-15 illustrate cross-sectional views along line B-B of structure of FIG. 7 at various stages of its fabrication, according to some embodiments. Operations can be performed in a different order or not performed depending on specific applications. Method 600 may not produce a complete semiconductor device 100. Accordingly, it is understood that additional processes can be provided before, during, and/or after method 600, and that some other processes may be briefly described herein. Further, the discussion of elements in FIGS. 1-16 with the same annotations applies to each other, unless mentioned otherwise.

Referring to FIG. 6, in operation 605, a fin structure is formed over a substrate. For example, as shown in FIG. 7, fin structure 108 with buffer layer 108A and channel layer 108CH can be formed over substrate 102. In some embodiments, FIG. 7's fin structure 108 can be FET 101's fin structure 108 (e.g., PFET's fin structure 108) after performing method 600. The process of forming fin structures 108 can include (i) providing substrate 102, (ii) epitaxially growing channel layer 108CH with thickness $H_{108CH}$ over substrate 102 using a suitable epitaxial growth process, and (iii) etching channel layer 108CH and substrate 102 through a patterned mask layer (not shown in FIG. 7) to define buffer layer 108A using an etching process. In some embodiments, channel layer 108CH can be selectively grown over a portion of substrate 102 designated for placing FET 101, where another portion (not shown in FIG. 7) of substrate 102 designated for FET 103 can be free from channel layer 108CH. In some embodiments, the process of forming fin structures 108 can further include (i) epitaxially growing buffer layer 108A between substrate 102 and channel layer 108CH using a suitable epitaxial growth process, and (ii) etching channel layer 108CH and the grown buffer layer 108A to define fin structure 108 using an etching process.

The epitaxial growth process for growing channel layer 108CH can include a chemical vapor deposition (CVD) process, a low pressure CVD (LPCVD) process, a rapid thermal CVD (RTCVD) process, a metal-organic CVD (MOCVD) process, an atomic layer CVD (ALCVD) process, an ultrahigh vacuum CVD (UHVCVD) process, a reduced pressure CVD (RPCVD) process, an atomic layer deposition (ALD) process, a molecular beam epitaxy (MBE) process, a cyclic deposition-etch (CDE) process, or a selective epitaxial growth (SEG) process. The etching process for etching channel layer 108CH, substrate 102, and/or buffer layer 108A can include a dry etching process or a wet etching process. In some embodiments, the dry etching process can include using any suitable etchant, such as an oxygen-containing gas, a fluorine-containing gas, a chlorine-containing gas, and a bromine-containing gas, and the wet etching process can include etching in any suitable wet etchant, such as diluted hydrofluoric acid, potassium hydroxide solution, ammonia, and nitric acid. Other epitaxial growth processes and etching processes for forming fin structure 108 are within the spirit and scope of this disclosure.

Referring to FIG. 6, in operation 610, a recess structure is formed in a fin structure. For example, a recess structure 1036 (shown in FIG. 10) can be formed in fin structure 108 with references to FIGS. 8-10. Recess structure 1036 can be formed in portions of fin structures 108 that are designated for FETs 101. The process of forming recess structure 1036 can include (i) blanket depositing an oxide layer and a polysilicon layer over the structure of FIG. 7 using a suitable deposition process, such as a CVD process, a physical vapor deposition (PVD) process, and an ALD process, and (ii) etching the deposited polysilicon layer and the deposited oxide layer to define polysilicon layer 812 (shown in FIG. 8) and oxide layer 806 (shown in FIG. 8) through a patterned mask layer (not shown in FIG. 8) using an etching process. In some embodiments, the etching process for defining oxide layer 806 can further etch a top portion of channel layer 108CH, thus causing an indented portion (e.g., shown as FIG. 8's recess structure 836) of a depth $d_{114}$ (later becoming FIG. 2's separation $d_{114}$ after method 600) at channel layer 108CH's top surface.

Figure 10:
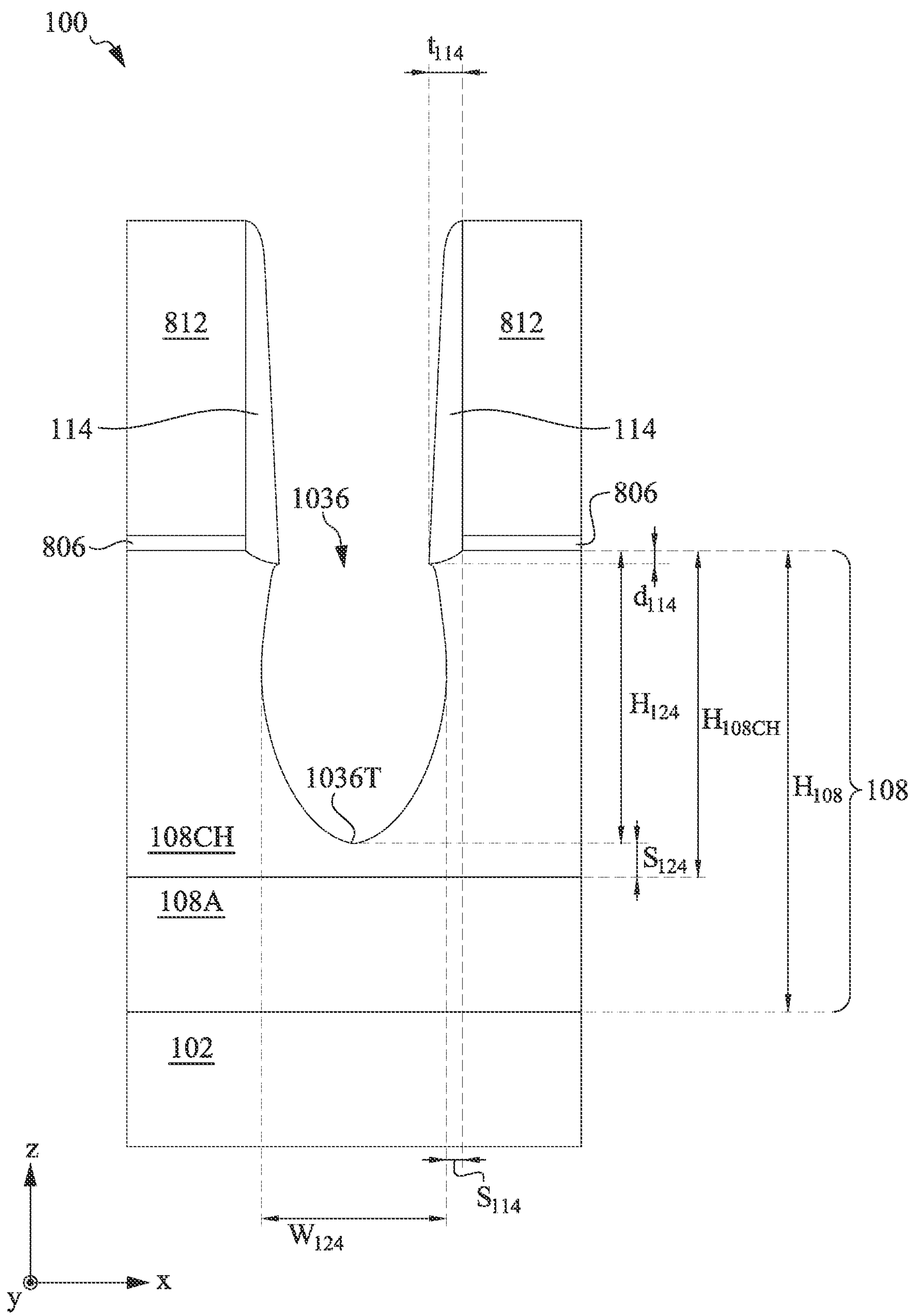

The process of forming recess structure 1036 can further include (i) forming gate spacers 114 (shown in FIG. 9) with thickness $t_{114}$ over sidewalls of polysilicon layer 812 using a suitable deposition process and an etching process, and (ii) etching channel layer 108CH through polysilicon layer 812 and gate spacer 114 using an etching process to define recess structure 1036 (shown in FIG. 10). The resulting recess structure 1036 can expose channel layer 108CH's two opposite side surfaces in the x-direction (not shown in FIG. 10). Recess structure 1036's two opposite side surfaces in the x-direction can extend towards the adjacent FET 101's channel regions (e.g., portions of channel layer 108CH that is under polysilicon layers 812). Accordingly, the vertex of recess structure 1036's side surface can be laterally separated from the adjacent FET 101's channel region by separation $S_{114}$ that is less than gate spacer 114's thickness $t_{114}$. Further, the resulting recess structure 1036 can protrude into channel layer 108CH with a depth $H_{124}$ (e.g., later becoming S/D region 124's vertical dimension $H_{124}$ of FIG. 2). As previously discussed in FIG. 2, since depth $H_{124}$ can be less than channel layer 108CH's thickness $H_{108CH}$ to avoid degrading strain in FET 101's channel region, recess structure 1036's bottom surface 1036T can be above channel layer 108CH's bottom surface. In some embodiments, a ratio of depth $H_{124}$ to channel layer 108CH's thickness $H_{108CH}$ can be from about 0.8 to about 0.95. If the ratio of depth $H_{124}$ to channel layer 108CH's thickness $H_{108CH}$ is less than the above-noted lower limit, S/D region 124 may not have sufficient volume to reduce FET 101's resistance, thus degrading FET 101's speed. If the ratio of depth $H_{124}$ to channel layer 108CH's thickness $H_{108CH}$ is greater than the above-noted upper limit, S/D region 124 may not induce sufficient strain in FET 101's channel region, thus failing to meet FET 101's high mobility requirement. In some embodiments, operations 615-625 (discussed below) can be performed on FIG. 10's recess structure 1036 to result in S/D region 124 of FIG. 2 or 4.

Figure 11:
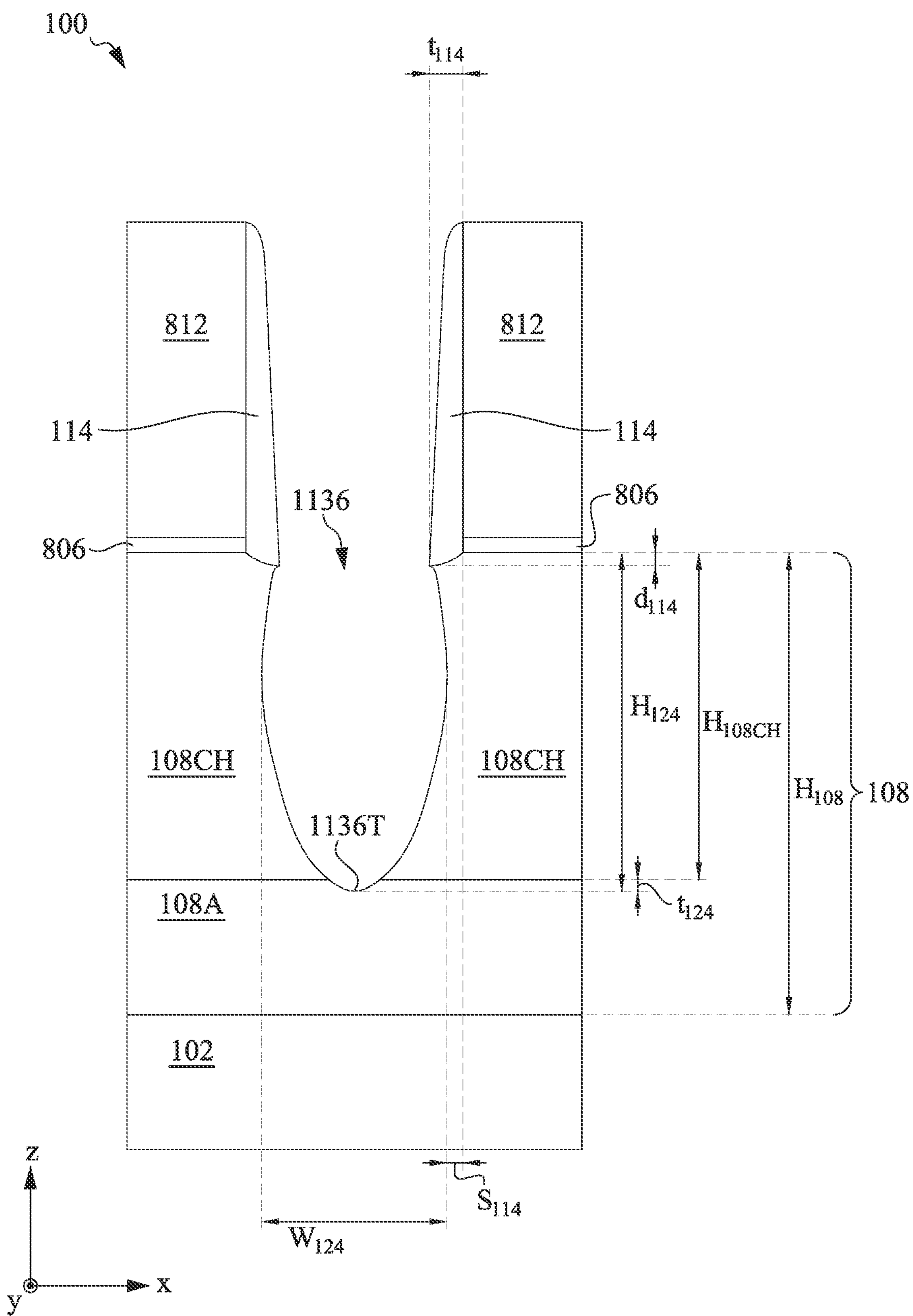

Referring to FIG. 11, in some embodiments, operation 610 can further include extending, via an etching process, FIG. 10's recess structure 1036 through channel layer 108CH to form a recess structure 1136 to expose buffer layer 108A. Recess structure 1136 can protrude into buffer layer 108A by penetration depth $t_{124}$. In some embodiments, recess structure 1136's depth $H_{124}$ (shown in FIG. 11; later becoming S/D region 124's vertical dimension $H_{124}$ of FIG. 5) can be substantially equal to channel layer 108CH's thickness $H_{108CH}$. In some embodiments, operations 615-625 (discussed below) can be performed on FIG. 11's recess structure 1136 to result in S/D region 124 of FIG. 5.

Figure 12:
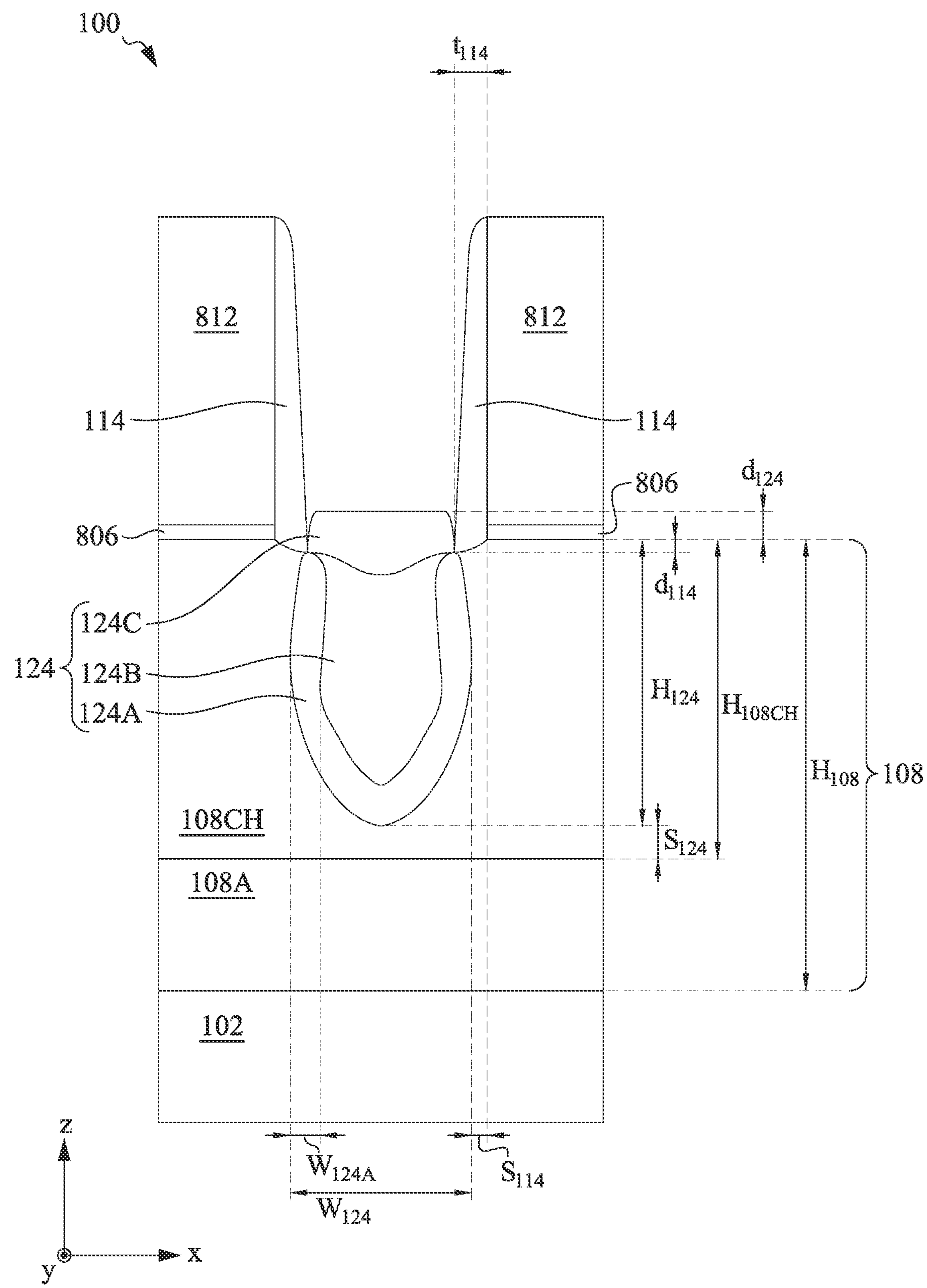
Figure 13:
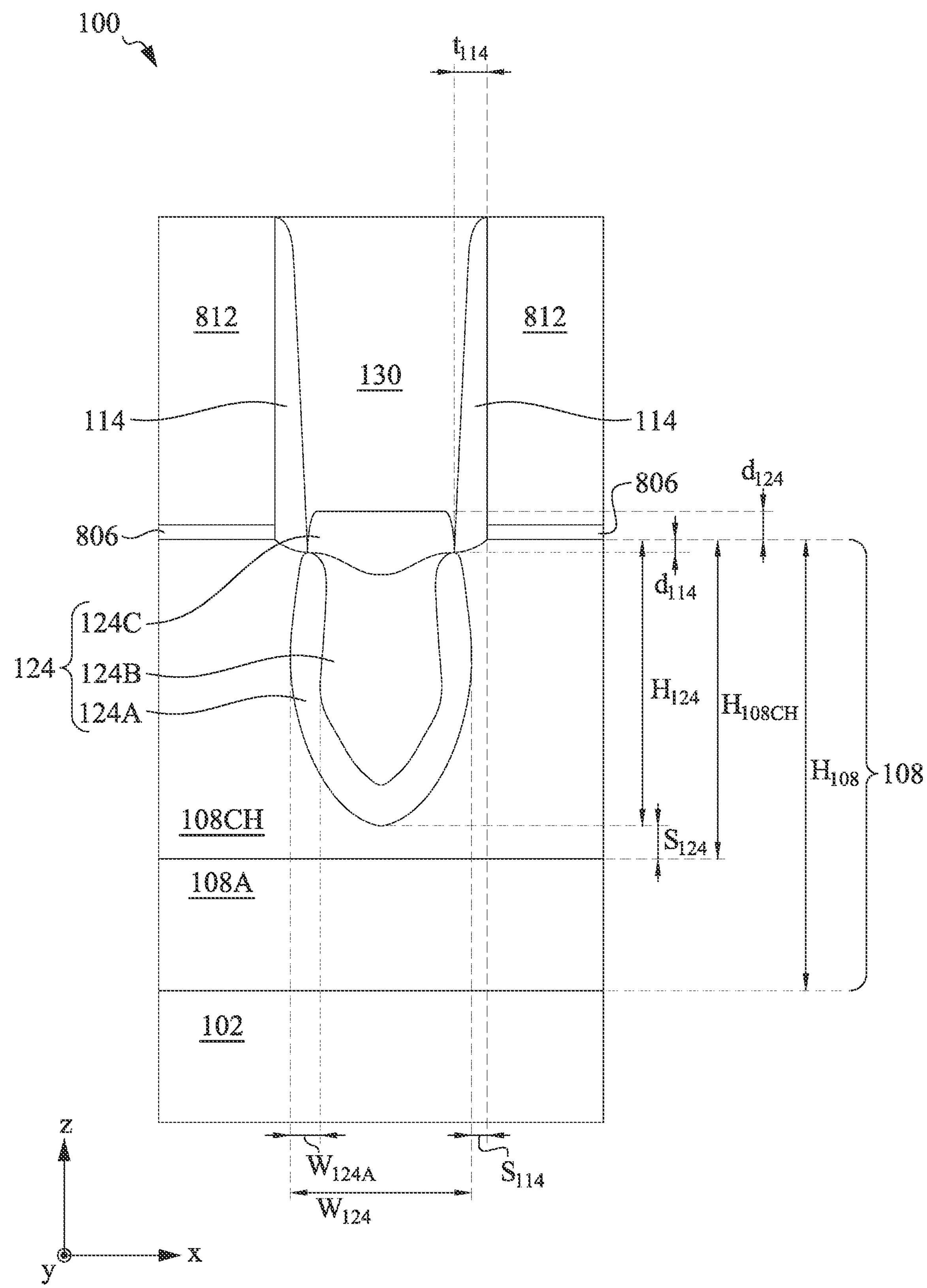
Figure 14:
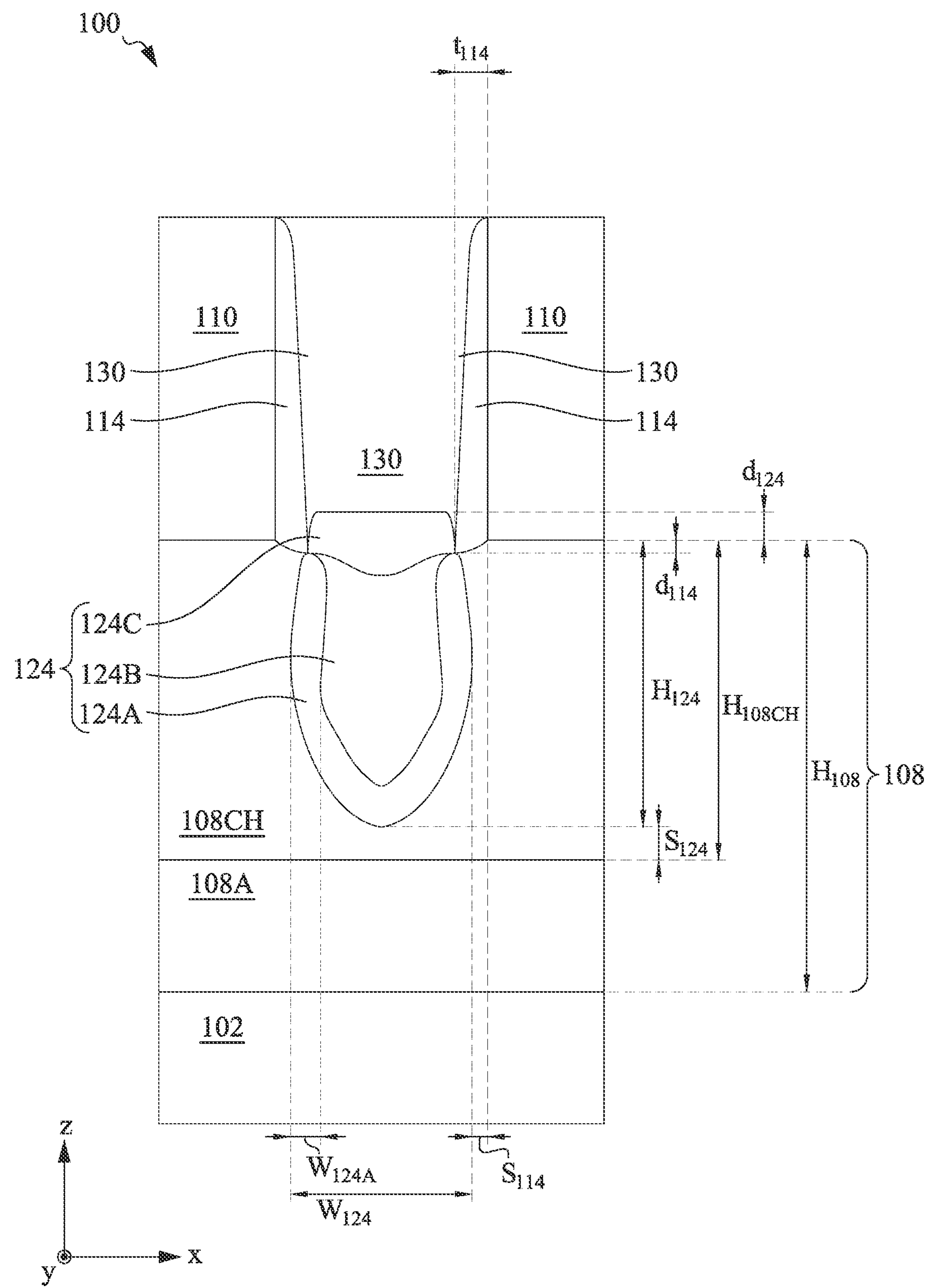
Figure 15:
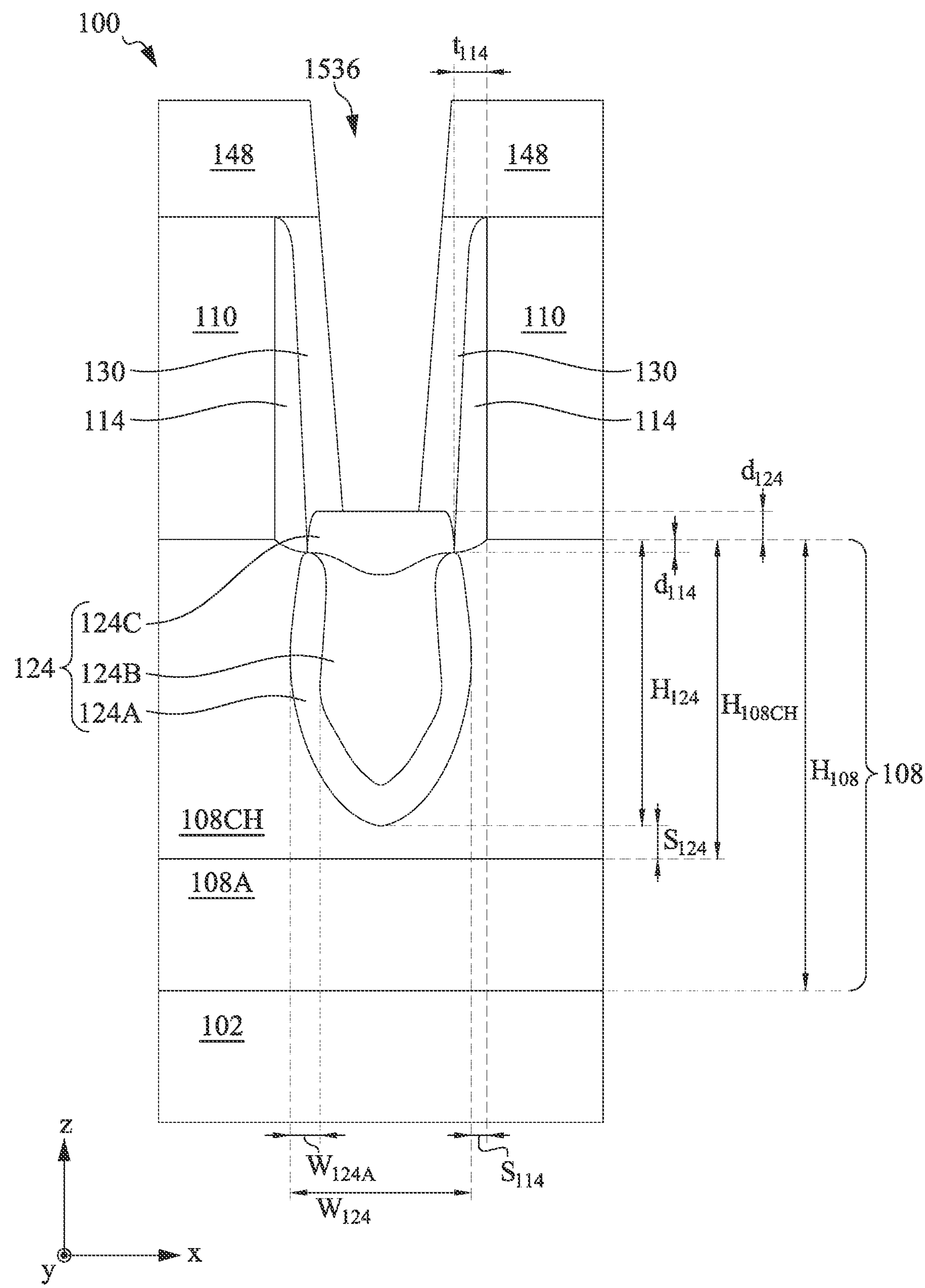

Referring to FIG. 6, in operation 615, a S/D epitaxial region is formed in the recess structure. For example, as shown in FIG. 12, S/D region 124 can be formed in the FIG. 10's recess structure 1036 or FIG. 11's recess structure 1136. The process of forming S/D region 124 can include (i) epitaxially growing, via an epitaxial growth process, first layer 124A of a thickness substantially equal to horizontal dimension $W_{124A}$ in recess structure 1036 or recess structure 1136, (ii) epitaxially growing, via the epitaxial growth process, second layer 124B over first layer 124A, and (iii) epitaxially growing capping layer 124C over second layer 124B and over channel layer 108CH by vertical dimension $d_{124}$.

The epitaxial growth process for forming S/D region 124 can include (i) a CVD process, such as a LPCVD process, a RTCVD process, a MOCVD process, an ALCVD process, an UHVCVD process, and a RPCVD process; (ii) a MBE processes; (iii) an epitaxial deposition/partial etch process, such as a CDE process; or (iv) a SEG process. The epitaxial process can be performed using suitable processing gases associated with the semiconductor material of first layer 124A second layer 124B, and capping layer 124C. For example, each of first layer 124A, second layer 124B, and capping layer 124C can include SiGe, where the processing gases can include silane ($SiH_4$), disilane ($Si_2H_6$), dichlorosilane (DCS), germane ($GeH_4$), hydrogen (Hz), and nitrogen ($N_2$). The process of forming S/D region 124 can further include doping each of first layer 124A second layer 124B, and capping layer 124C with dopants during the epitaxial growth process using a suitable dopant precursor gas, such as diborane ($B_2H_6$), boron difluoride ($BF_2$), and boron trifluoride ($BF_3$).

In some embodiments, operation 615 can further include growing S/D region 126 (e.g., growing first layer 126A and second layer 126B) (shown in FIG. 3) for FET 103 via the epitaxial growth process. The epitaxial growth process for growing S/D region 126 can be similar to the epitaxial growth process for S/D region 124 for a suitable processing gases, such as $SiH_4$, $Si_2H_6$, DCS, $H_2$, and $N_2$. The epitaxial process for growing S/D region 126 can further include doping each of first layer 126A and second layer 124B with dopants during the epitaxial growth process using a suitable dopant precursor gas, such as arsine ($AsH_3$) and phosphine ($PH_3$).

Referring to FIG. 6, in operation 620, a metal gate structure is formed over the fin structure and adjacent to the S/D epitaxial region. For example, referring to FIGS. 13 and 14, metal gate structure 110 can be formed over fin structure 108 and adjacent to S/D region 124. The process of forming gate structure 110 can include (i) forming ILD layer 130 (shown in FIG. 13) over second layer 124B using a suitable deposition process, such as a PVD process and a CVD process, and a polishing process, such as a chemical mechanical polishing (CMP) process; (ii) removing polysilicon layer 812 and oxide layer 806 to form a recess structure (not shown in FIG. 13) to expose fin structures 108 using an etching process; and (iii) filling the recess structure with a gate dielectric layer and a gate electrode using a suitable deposition process, such as ALD, CVD, and PVD, and a CMP process to define metal gate structure 110 of FIG. 14. Based on the disclosure herein, other processes for forming gate structure 110 are within the spirit and scope of this disclosure.

Referring to FIG. 6, in operation 625, a S/D metal contact is formed over the S/D epitaxial region. For example, referring to FIGS. 2 and 15, silicide layer 152 and layer of conductive material 154 can be formed over S/D region 124. The process of forming silicide layer 152 and layer of conductive material 154 can include (i) blanket depositing layer of insulating material 148 over ILD layer 130 via a deposition process, such as a CVD process, a PVD process, and an ALD process; (ii) forming, via a lithography process and an etching process, a recess structure 1536 (shown in FIG. 15) through layer of insulating material 148 and ILD layer 130; (iii) forming silicide layer 152 (shown in FIG. 2) in the recess structure 1536; and (iv) forming layer of conductive material 154 (shown in FIG. 2) over silicide layer 152 using a suitable deposition process (e.g., a CVD process, an ALD process, a PVD process, and an e-beam evaporation process) and a polishing process (e.g., a CMP process). Based on the disclosure herein, other processes for forming silicide layer 152 and layer of conductive material 154 are within the spirit and scope of this disclosure.

The present disclosure provides embodiments of a transistor S/D structure and a method for forming the same. The transistor can be a PFET with a p-type S/D structure. The method for forming the transistor can include epitaxially growing a layer of high mobility material ("channel layer"), such as a SiGe layer, over a substrate, such as a Si substrate. The method can further include etching a top portion of the channel layer to form a recess structure to expose a bottom portion of the channel layer. Namely, the recess structure's depth can be less than or substantially equal to the channel layer's thickness. The method can further include epitaxially growing the S/D structure in the recess structure. Hence, the resulting S/D structure's bottom surface can be above or substantially coplanar with the channel layer's bottom surface. The method can further include forming a metal gate structure adjacent to the S/D structure to define the transistor's channel region. By avoiding the S/D structure penetrating through channel layer, the strain induced in the transistor's channel region can be maintained. A benefit of the S/D structure, among others, is to provide a sufficient strain for the transistor with the high mobility channel layer (e.g., the SiGe channel layer), thus improving the transistor's performance.

In some embodiments, a method can include forming a fin structure over a substrate. The fin structure can include a channel layer and a buffer layer between the channel layer and the substrate. The method can further include forming a recess structure in the channel layer. The recess structure can include a bottom surface over the buffer layer. The method can further include forming a first epitaxial layer over the bottom surface of the recess structure. The first epitaxial layer can include a first atomic concentration of germanium. The method can further include forming a second epitaxial layer over the first epitaxial layer. The second epitaxial layer can include a second atomic concentration of germanium greater than the first atomic concentration of germanium.

In some embodiments, a method can include forming a fin structure over a substrate. The fin structure can include a channel layer with a top surface being exposed and made of a different material from the substrate. The method can further include forming a gate structure over the top surface of the channel layer and forming a recess structure in a first portion of the channel layer and over a second portion of the channel layer. The recess structure can be adjacent to the gate structure. The method can further include forming a source/drain epitaxial layer in the recess structure.

In some embodiments, a semiconductor structure can include a substrate and a fin structure over the substrate. The fin structure can include a channel layer and a buffer layer between the channel layer and the substrate. The channel layer and buffer layer can include different germanium atomic concentrations. The semiconductor structure can further include a gate structure over a first portion of the fin structure and a source/drain (S/D) region formed over a second portion of the fin structure. A first thickness of the channel layer of the first portion of the fin structure can be greater than a second thickness of the second portion of the fin structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a fin structure over a substrate, wherein the fin structure comprises a channel layer and a buffer layer between the channel layer and the substrate;

forming a recess structure in the channel layer, wherein the recess structure comprises a bottom surface over the buffer layer;

forming a first epitaxial layer over the bottom surface of the recess structure, wherein the first epitaxial layer comprises a first atomic concentration of germanium; and forming a second epitaxial layer over the first epitaxial layer, wherein the second epitaxial layer comprises a second atomic concentration of germanium greater than the first atomic concentration of germanium.

2. The method of claim 1, wherein forming the fin structure comprises epitaxially growing the channel layer with a channel thickness over the buffer layer, wherein a ratio of the channel thickness to a height of the fin structure is from about 0.1 to about 0.5.

3. The method of claim 2, wherein epitaxially growing the channel layer comprises epitaxially growing a germanium-containing material with a third atomic concentration of germanium less than the second atomic concentration of germanium.

4. The method of claim 3, wherein the buffer layer comprises an identical material as the substrate.

5. The method of claim 1, wherein forming the recess structure comprises etching the channel layer with an etching depth to define the bottom surface of the recess structure, wherein a ratio of the etching depth to a thickness of the channel layer is from about 0.8 to about 0.95.

6. The method of claim 1, wherein forming the recess structure comprises etching a first portion of the channel layer to define the bottom surface of the recess structure, wherein a ratio of the thickness of a second portion of the channel layer to an other thickness of the channel layer is from about 0.05 to about 0.2.

7. The method of claim 1, wherein forming the fin structure comprises epitaxially growing an other channel layer over the channel layer, wherein forming the recess structure comprises forming the recess structure through the other channel layer, and wherein the bottom surface of the recess structure is above a bottom surface of the channel layer.

8. A method, comprising:

forming a fin structure over a substrate, wherein the fin structure comprises a channel layer with a top surface being exposed and made of a different material from the substrate;

forming a gate structure over the top surface of the channel layer;

forming a recess structure in a first portion of the channel layer and over a second portion of the channel layer, wherein the recess structure is adjacent to the gate structure; and forming a source/drain (S/D) epitaxial layer in the recess structure.

9. The method of claim 8, wherein forming the fin structure comprises epitaxially growing the channel layer with a first germanium atomic concentration, and wherein forming the S/D epitaxial layer comprises epitaxially growing the S/D epitaxial layer with a second germanium atomic concentration greater than the first germanium atomic concentration.

10. The method of claim 8, wherein forming the fin structure comprises epitaxially growing the first and second portions of the channel layer with first and second germanium atomic concentrations, respectively, and wherein the first germanium atomic concentration is less than the second germanium atomic concentration.

11. The method of claim 8, wherein forming the fin structure comprises epitaxially growing the channel layer with a channel thickness, wherein forming the recess structure comprises etching the channel layer with an etching depth, and a ratio of the etching depth to the channel thickness is from about 0.8 to about 0.95.

12. The method of claim 8, wherein forming the fin structure comprises forming a buffer layer between the substrate and the channel layer, and wherein the buffer layer and the substrate comprise an identical material.

13. The method of claim 8, wherein forming the gate structure comprises:

forming a polysilicon gate structure over a top surface of the fin structure;

forming an other recess structure adjacent to the polysilicon gate structure and protruding into an indented portion of the top surface of the fin structure; and forming a spacer over the polysilicon gate structure and over the indented portion of the top surface of the fin structure.

14. The method of claim 8, further comprising extending the recess structure through the second portion of the channel layer, wherein a depth of the extended recess structure is substantially equal to a thickness of the channel layer, and wherein forming the S/D epitaxial layer comprises epitaxially growing the S/D epitaxial layer in the extended recess structure.

15. A semiconductor structure, comprising:

a substrate;

a fin structure over the substrate, wherein:

the fin structure comprises a buffer layer in contact with the substrate and a channel layer in contact with the buffer layer;

the channel layer comprises silicon germanium with a first germanium atomic concentration; and the buffer layer comprises silicon germanium with a second germanium atomic concentration different from the first germanium atomic concentration;

a gate structure over a first portion of the fin structure; and a source/drain (S/D) region formed directly above a second portion of the fin structure, wherein the second portion of the fin structure separates the S/D region and the buffer layer, and wherein a first thickness of the channel layer of the first portion of the fin structure is greater than a second thickness of the channel layer of the second portion of the fin structure.

16. The semiconductor structure of claim 15, wherein a ratio of the second thickness to the first thickness is from about 0.05 to about 0.2.

17. The semiconductor structure of claim 15, wherein a ratio of a separation between the S/D region and the buffer layer of the second portion of the fin structure to the first thickness is from about 0.05 to about 0.2.

18. The semiconductor structure of claim 15, wherein the second germanium atomic concentration is less than the first germanium atomic concentration.

19. The semiconductor structure of claim 15, wherein the channel layer comprises a top portion with the first germanium atomic concentration and a bottom portion with a third germanium atomic concentration, the first germanium atomic concentration being greater than the second germanium atomic concentration and the third germanium atomic concentration being greater than the first germanium atomic concentration.

20. The semiconductor structure of claim 15, further comprising a gate spacer formed adjacent to the gate structure and over a third portion of the fin structure, wherein a top surface of the third portion of the fin structure is lower than an other top surface of the first portion of the fin structure.

* * * * *